(12) United States Patent
Bruel et al.

(10) Patent No.: US 9,851,382 B2
(45) Date of Patent: Dec. 26, 2017

(54) POWER METER WITH CURRENT AND PHASE SENSOR

(71) Applicant: SCHNEIDER ELECTRIC USA, INC., Palatine, IL (US)

(72) Inventors: Marc Bruel, Corenc Isere (FR); Paul Buda, Raleigh, NC (US); Colin Gunn, Cowichan Bay (CA); Roy Colby, Raleigh, NC (US); Alexander Filippenko, Cary, NC (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 75 days.

(21) Appl. No.: 14/655,916

(22) PCT Filed: Dec. 27, 2012

(86) PCT No.: PCT/US2012/071772
§ 371 (c)(1),
(2) Date: Jun. 26, 2015

(87) PCT Pub. No.: WO2014/105018
PCT Pub. Date: Jul. 3, 2014

(65) Prior Publication Data
US 2015/0331024 A1    Nov. 19, 2015

(51) Int. Cl.
*G01R 21/133* (2006.01)
*G01R 21/06* (2006.01)
*G01R 19/25* (2006.01)

(52) U.S. Cl.
CPC ....... *G01R 21/133* (2013.01); *G01R 19/2513* (2013.01); *G01R 21/06* (2013.01)

(58) Field of Classification Search
CPC ........ G01R 22/10; G01R 35/04; G01R 21/06; G01R 22/00; G01R 21/133
(Continued)

(56) References Cited

U.S. PATENT DOCUMENTS

| | | |
|---|---|---|
| 4,158,808 A | 6/1979 | Massa et al. |
| 4,258,348 A | 3/1981 | Belfer et al. |

(Continued)

FOREIGN PATENT DOCUMENTS

| | | |
|---|---|---|
| CN | 1495432 A | 5/2004 |
| CN | 1717844 A | 1/2006 |

(Continued)

OTHER PUBLICATIONS

"Oscillator Options", Meinberg, https://meinbergglobal.com, Nov. 2015.

(Continued)

*Primary Examiner* — Jermele M Hollington
*Assistant Examiner* — Christopher McAndrew
(74) *Attorney, Agent, or Firm* — Lando & Anastasi, LLP (57) ABSTRACT

According to one aspect, embodiments of the invention provide a power meter comprising a voltage sensor, at least one current and phase sensor circuit, and a central metering unit, wherein the voltage sensor is further configured to measure a voltage on an input line and transmit a signal related to the voltage to the central metering unit, wherein the at least one current and phase sensor circuit is further configured to measure a current and a voltage phase shift of a feeder line, and to transmit a signal related to at least one of the current of the feeder line and the voltage phase shift of the feeder line to the central metering unit, and wherein the central metering unit is configured to calculate power provided to a load via the feeder line based on the signal transmitted from the at least one current and phase sensor circuit.

20 Claims, 3 Drawing Sheets

(58) Field of Classification Search
USPC .................................................... 324/142
See application file for complete search history.

(56) References Cited

U.S. PATENT DOCUMENTS

| | | | |
|---|---|---|---|
| 5,179,376 A | | 1/1993 | Pomatto |
| 5,416,808 A | | 5/1995 | Witsaman et al. |
| 5,420,523 A | * | 5/1995 | Walker ............... G01R 31/343 324/545 |
| 5,800,187 A | | 9/1998 | Vermon et al. |
| 5,831,428 A | | 11/1998 | Pyle et al. |
| 5,855,491 A | | 1/1999 | Hintner et al. |
| 5,896,027 A | | 4/1999 | So et al. |
| 5,914,666 A | * | 6/1999 | Zingsheim ............ H04L 12/423 340/3.43 |
| 5,959,818 A | | 9/1999 | Blakely |
| 5,995,911 A | | 11/1999 | Hart |
| 6,064,192 A | | 5/2000 | Redmyer |
| 6,091,237 A | | 7/2000 | Chen |
| 6,243,626 B1 | | 6/2001 | Schanin |
| 6,291,986 B1 | | 9/2001 | Sorensen |
| 6,292,108 B1 | | 9/2001 | Straser et al. |
| 6,292,717 B1 | | 9/2001 | Alexander et al. |
| 6,313,641 B1 | | 11/2001 | Brooks |
| 6,330,516 B1 | | 12/2001 | Kammeter |
| 6,373,238 B2 | | 4/2002 | Lewis et al. |
| 6,452,767 B1 | | 9/2002 | Brooks |
| 6,634,240 B1 | | 10/2003 | Wallen |
| 6,788,508 B2 | | 9/2004 | Papallo, Jr. et al. |
| 6,792,337 B2 | | 9/2004 | Blackett et al. |
| 6,865,073 B2 | | 3/2005 | Werner et al. |
| 7,068,184 B2 | * | 6/2006 | Yee ........................ G01D 3/08 105/40 |
| 7,174,258 B2 | * | 2/2007 | Hart ....................... G01D 4/004 700/296 |
| 7,218,122 B1 | * | 5/2007 | Nastasi ................ G01R 31/001 324/107 |
| 7,253,640 B2 | | 8/2007 | Engel et al. |
| 7,265,533 B2 | | 9/2007 | Lightbody et al. |
| 7,412,338 B2 | | 8/2008 | Wynans et al. |
| 7,453,267 B2 | | 11/2008 | Westbrock, Jr. et al. |
| 7,478,003 B2 | * | 1/2009 | Cowan ................. G01R 22/065 702/117 |
| 8,004,226 B2 | | 8/2011 | Hartman et al. |
| 8,321,163 B2 | | 11/2012 | Ewing et al. |
| 8,624,578 B2 | * | 1/2014 | Rupert ................ G01R 21/133 324/110 |
| 8,700,747 B2 | | 4/2014 | Spitaels et al. |
| 8,787,372 B2 | | 7/2014 | Cohen et al. |
| 8,958,923 B2 | | 2/2015 | Kake et al. |
| 9,267,826 B2 | | 2/2016 | Paik et al. |
| 9,341,686 B2 | * | 5/2016 | Deak ..................... G01R 21/06 |
| 2003/0222603 A1 | | 12/2003 | Mogilner et al. |
| 2004/0075343 A1 | | 4/2004 | Wareham et al. |
| 2004/0128087 A1 | | 7/2004 | Viaro et al. |
| 2004/0136124 A1 | | 7/2004 | Engel et al. |
| 2004/0183522 A1 | | 9/2004 | Gunn et al. |
| 2005/0210337 A1 | | 9/2005 | Chester et al. |
| 2006/0238932 A1 | | 10/2006 | Westbrock et al. |
| 2007/0069715 A1 | * | 3/2007 | Bruno .................. G01R 21/133 324/76.11 |
| 2007/0136010 A1 | | 6/2007 | Gunn et al. |
| 2008/0007416 A1 | | 1/2008 | Cern |
| 2008/0094162 A1 | | 4/2008 | Schaerrer et al. |
| 2008/0126665 A1 | | 5/2008 | Burr et al. |
| 2008/0180275 A1 | | 7/2008 | Whitaker et al. |
| 2008/0238573 A1 | | 10/2008 | Yamazaki |
| 2009/0066317 A1 | | 3/2009 | de Buda |
| 2009/0115403 A1 | | 5/2009 | Bernklau |
| 2009/0292403 A1 | | 11/2009 | Howell et al. |
| 2010/0033122 A1 | | 2/2010 | Hartman et al. |
| 2010/0060469 A1 | | 3/2010 | Hetzmannseder et al. |
| 2010/0085036 A1 | | 4/2010 | Banting et al. |
| 2010/0207604 A1 | * | 8/2010 | Bitsch .................. G01R 21/133 324/140 R |
| 2010/0235122 A1 | | 9/2010 | McCrea et al. |
| 2010/0237853 A1 | | 9/2010 | Bose et al. |
| 2010/0264906 A1 | | 10/2010 | Shamir et al. |
| 2010/0280774 A1 | | 11/2010 | Ewing et al. |
| 2010/0299401 A1 | | 11/2010 | Lloyd |
| 2010/0301837 A1 | | 12/2010 | Higuma et al. |
| 2010/0308792 A1 | * | 12/2010 | Rupert ................ G01R 21/133 324/76.77 |
| 2010/0328849 A1 | | 12/2010 | Ewing et al. |
| 2011/0046792 A1 | | 2/2011 | Imes et al. |
| 2011/0098952 A1 | | 4/2011 | Long et al. |
| 2011/0148393 A1 | | 6/2011 | de Buda |
| 2011/0260710 A1 | * | 10/2011 | Zhu ..................... G01R 19/0084 324/123 R |
| 2011/0285362 A1 | * | 11/2011 | Huomo ................ H02J 3/1892 323/205 |
| 2012/0062249 A1 | | 3/2012 | Shamir |
| 2012/0085627 A1 | | 4/2012 | Yang |
| 2012/0130656 A1 | * | 5/2012 | Bickel ................ H02J 13/0006 702/60 |
| 2012/0191878 A1 | | 7/2012 | Yoshida |
| 2012/0200285 A1 | | 8/2012 | Carpenter et al. |
| 2012/0203481 A1 | | 8/2012 | Carpenter et al. |
| 2012/0271570 A1 | | 10/2012 | Paik et al. |
| 2012/0271579 A1 | | 10/2012 | Deokar et al. |
| 2013/0014894 A1 | * | 1/2013 | Lai ..................... H01J 37/32082 156/345.28 |
| 2013/0017315 A1 | * | 1/2013 | Lai ..................... H01J 37/32082 427/8 |
| 2013/0018609 A1 | | 1/2013 | Filippenko et al. |
| 2013/0090869 A1 | | 4/2013 | Ewing et al. |
| 2013/0165107 A1 | | 6/2013 | Richardson |
| 2014/0062471 A1 | * | 3/2014 | Deak ..................... G01R 21/06 324/252 |
| 2015/0331024 A1 | * | 11/2015 | Bruel .................... G01R 21/06 324/142 |

FOREIGN PATENT DOCUMENTS

| | | |
|---|---|---|
| CN | 201035075 Y | 3/2008 |
| CN | 101277130 A | 10/2008 |
| CN | 201667273 U | 12/2010 |
| CN | 102122810 A | 7/2011 |
| CN | 102299559 A | 12/2011 |
| CN | 102393485 A | 3/2012 |
| DE | 29512624 U1 | 11/1995 |
| DE | 10201495 A1 | 8/2003 |
| DE | 102009003654 B3 | 10/2010 |
| EP | 1102073 A1 | 5/2001 |
| EP | 1 703 289 A1 | 9/2006 |
| EP | 1983616 A2 | 10/2008 |
| EP | 2 354 799 A1 | 8/2011 |
| GB | 2 241 396 A | 8/1991 |
| WO | 2005029671 A1 | 3/2005 |
| WO | 2006021030 A1 | 3/2006 |
| WO | 2011/150173 A1 | 12/2011 |

OTHER PUBLICATIONS

"PowerLogic ION7300 Series, Power & Energy Meter, Modicon Modbus Serial Communications Protocol", Schneider Electric, Dec. 2006.

"Protime 100 Sequence of Event Recorder User's Guide", Monaghan Engineering, Inc., Publication #10032, Version 1.10, Sep. 10, 2013.

"SICAM I/O Unit 7XV5673 Device Manual", Siemens, E50417-H1040-C484-A4, Nov. 2014.

"Time stamping and synchronisation", Current Trends, EBG—Electrical Systems & Equipment, Larsen & Toubro Limited, Powai Works, Mumbai 400 072, Jan.-Mar. 2004.

"Time Synchronization & Timekeeping", Schneider Electric, 70072-0111-14, Jun. 2009.

"Time Synchronization in Electrical Systems", Meinberg, [<https://www.meinbergglobal.com/english/info/time-synchronization-electrical-systems.htm>], Retrieved from the Internet on Jul. 1, 2016.

"Time Synchronization Using ABB Relays", ABB Application (56) References Cited

OTHER PUBLICATIONS

Note, Substation Automation and Protection Dvision, AN-96A-04, DPU2000R, Jul. 7, 2004.
Cristian et al., "Probabilistic clock synchronization", Distributed Computing (1989) 3: pp. 146-158.
Extended European Search Report from corresponding European Application No. 12890858.9 dated Jul. 8, 2016.
"Emonitor Installation Guide", 2010 PowerHouse Dynamics, Inc., pp. 1-39.
"Emonitor User Manual", 2010 PowerHouse Dynamics, Inc., pp. 1-50.
"Panelboard Monitoring System", www.veris.com, 2008 Veris Industries, pp. 136-137.
"TED 5000 Footprints User Manual", www.theenergydetective.com, pp. 1-37.
Chung-Ping Young et al., "Digital Power Metering Manifold", IEEE Transactions on Instumentation and Measurement, IEEE Service Center, Piscataway, NJ, US, vol. 47, No. 1, Feb. 1, 1998 (Feb. 1, 1998), XP011024460, pp. 224-228.
Mars, Using a supercapacitor to manage your power, Energy Harvesting Journal, Dec. 14, 2009, pp. 1-11.
Notification of Transmittal of the International Search Report and the Written Opinion of the International Searching Authority from corresponding PCT/US2012/071772 dated Mar. 1, 2013.
Power Systems Design, Smart Grid Integrity, 2010, http://www.powersystemsdesign.com/smart-grid-integrity.

\* cited by examiner

POWER METER WITH CURRENT AND PHASE SENSOR

This application is a U.S. National Stage Application under 35 U.S.C. §371 of International Application No. PCT/US2012/071772, filed Dec. 27, 2012, which is hereby incorporated by reference in its entirety for all purposes.

BACKGROUND OF INVENTION

1. Field of Invention

At least one embodiment of the present invention relates generally to systems and methods for metering AC power, and more specifically, to an AC power meter including a current and phase shift sensor.

2. Discussion of Related Art

A load center, panelboard, or electrical switchboard is a component of an electrical supply system which divides an electrical power feed from a power line into different subsidiary circuit branches (i.e. different feeder circuit branches). Each subsidiary circuit branch may be connected to a different load. Thus, by dividing the electrical power feed into subsidiary circuit branches, the load center may allow a user to individually control and monitor the current, power and energy usage of each branch circuit and in some instances each load.

SUMMARY OF INVENTION

At least one aspect of the invention is directed to a power meter, the power meter comprising a voltage sensor configured to be coupled to an input line that receives input AC power from an AC power source, at least one current and phase sensor circuit configured to be coupled to a feeder line that provides at least a portion of the input AC power from the input line to a load, and a central metering unit coupled to the voltage sensor, wherein the voltage sensor is further configured to measure a voltage on the input line and transmit a signal related to the voltage on the input line to the central metering unit, wherein the at least one current and phase sensor circuit is further configured to measure a current of the feeder line, to measure a voltage phase shift of the feeder line, and to transmit a signal related to at least one of the current of the feeder line and the voltage phase shift of the feeder line to the central metering unit, and wherein the central metering unit is configured to calculate power provided to the load via the feeder line based on the signal transmitted from the at least one current and phase sensor circuit.

According to one embodiment, the at least one current and phase sensor circuit comprises a current sensor configured to be coupled to the feeder line and to generate a signal proportional to the current in the feeder line, and a controller coupled to the current sensor, wherein the controller is configured to calculate the current of the feeder line based on the signal proportional to the current in the feeder line and transmit the signal related to the current of the feeder line to the central metering unit. In one embodiment, the current sensor is a Current Transformer (CT).

According to another embodiment, the at least one current and phase sensor further comprises a voltage phase sensor coupled to the feeder line, a capacitive voltage divider including the voltage phase sensor and a capacitor coupled between the voltage phase sensor and ground, the capacitive voltage divider having a capacitive voltage divider ratio, and wherein the central metering unit is further configured to transmit the signal related to the voltage on the input line to the controller, and wherein the controller is further coupled to the voltage phase sensor and configured to measure a voltage across the capacitor of the voltage divider, calculate the voltage phase shift of the feeder line based on the voltage across the capacitor, the signal related to the voltage on the input line, and the capacitive voltage divider ratio, and to transmit the signal related to the voltage phase shift of the feeder line to the central metering unit.

According to one embodiment, the voltage phase sensor comprises a voltage sensing layer configured to form a capacitive element with a conductor of the feeder line when the voltage phase sensor is coupled to the feeder line. In one embodiment, the voltage sensing layer is a conductive plate which is configured to encircle a portion of the conductor of the feeder line when the voltage phase sensor is coupled around the feeder line.

According to another embodiment, the at least one current and phase sensor further comprises a wireless communications circuit configured to wirelessly transmit the signal related to the current of the feeder line and the signal related to the voltage phase shift of the feeder line to the central metering unit. In one embodiment, the at least one current and phase sensor further comprises a power circuit coupled to the current sensor and configured to receive the signal proportional to the current in the feeder line, rectify the signal proportional to the current and provide resulting DC power to at least one of the controller and the wireless communications circuit.

According to one embodiment, the controller comprises a phase sensor coupled to the voltage divider, the phase sensor comprising a resistor having a resistance and coupled between the capacitive voltage divider and ground, a measurement amplifier coupled to the capacitive voltage divider, and a Digital Signal Processor (DSP) coupled to the measurement amplifier, wherein the DSP is configured to calculate the voltage phase shift of the feeder line based on the voltage across the capacitor, the signal related to the voltage on the input line, the capacitive voltage divider ratio and the resistance of the resistor.

According to another embodiment, the voltage phase sensor and the current sensor are coupled to the feeder line at substantially a same location. In another embodiment, the capacitor is an adjustable capacitor and wherein the controller is further configured to control the adjustable capacitor to adjust the capacitive voltage divider ratio. In one embodiment, at least one of the at least one current and phase sensor circuit, the voltage sensor, and the central metering unit are configured to be located within an electrical switchboard.

Another aspect of the invention is directed to a method for measuring power provided by a feeder line of an electrical system to a load, the electrical system receiving AC power from an AC source on an input line, the method comprising acts of measuring, with a voltage sensor coupled to the input line, an input voltage on the input line, measuring, with a current sensor coupled to the feeder line, a current of the feeder line, measuring, with a voltage phase sensor coupled to the feeder line, a voltage phase shift of the feeder line, and calculating, based on the current of the feeder line, the voltage phase shift of the feeder line and the common input voltage on the input line, a power level being provided to the load via the feeder line.

According to one embodiment, the method further comprises transmitting, by the voltage sensor, a signal related to the input voltage, to a central metering unit, and transmitting, by the central metering unit, a signal related to the input voltage to the voltage phase sensor.

According to another embodiment, measuring the voltage phase shift of the feeder line comprises measuring, with a controller coupled to the voltage phase sensor and the current sensor, a voltage produced by a capacitive voltage divider of the voltage phase sensor, the capacitive voltage divider having a capacitive voltage divider ratio, receiving, with the controller, the signal related to the common input voltage from the central metering unit, and calculating, with the controller, the voltage phase shift of the feeder line based on the voltage produced by the capacitive voltage divider, the capacitive voltage divider ratio and the common input voltage. In another embodiment, the method further comprises adjusting the capacitive voltage divider ratio to a desired range.

According to one embodiment, measuring the current of the feeder line comprises generating, with the current sensor, a signal proportional to the current of the feeder line, calculating, with the controller, based on the signal proportional to the current, the current of the feeder line.

According to another embodiment, the method further comprises transmitting wirelessly, with the controller, a signal related to the voltage phase shift of the feeder line and a signal related to the current of the feeder line to the central metering unit. In another embodiment, the acts of measuring a current of the feeder line and measuring voltage phase shift of the feeder line are performed at substantially a same location.

One aspect of the invention is directed to a system for measuring power provided by a feeder line of an electrical system to a load, the electrical system receiving AC power from an AC source on an input line, the system a voltage sensor configured to be coupled to the input line and to measure voltage on the input line, a central metering unit coupled to the voltage sensor and configured to receive, from the voltage sensor, a signal related to the voltage on the input line, and means for measuring current and voltage phase shift of the feeder line at substantially a same location and without direct connection to a conductor within the feeder line, wherein the central metering unit is configured to calculate power provided to the load via the feeder line based on the measured current and voltage phase shift of the feeder line.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Various embodiments and aspects thereof will now be discussed in detail with reference to the accompanying drawings. It is to be appreciated that this invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

The metering of AC power in a feeder line that is providing power to a load typically requires the near simultaneous sensing of current and voltage in the feeder line to take into account the power factor of the load.

One common approach for monitoring power provided by feeder line to a load is to couple a voltage and a current sensor at the same location on the feeder line. However, it is oftentimes impractical or difficult to locate the voltage and current sensors at the same location. For example, where the measurement of individual power provided to a load by a feeder line is desired, the current measurement of the feeder line may be achieved by using a Current Transformer (CT) on the feeder line. However, measuring the voltage of the feeder line at the same location may not be as practical (or safe), as it typically requires direct access to the energized circuit. In addition, measuring the voltage and the current at the same location may also be impractical if multiple feeder lines are being monitored and/or if the CT is located at a point where the conductor of the feeder line is isolated.

Another common approach for monitoring power of a feeder line is to separate the voltage and current sensing locations. For example, where it is desired to measure the power of a feeder line, the current and voltage measurements of the feeder line may be made at different locations and a Volt-Ampere (VA) power value of the feeder line may be calculated, rather than "real" power of the feeder line. A VA power value of a feeder line is calculated based on measured current through the feeder line along with a single voltage at the electrical switchboard (e.g., at the input of the switchboard) that is provided to all feeder lines within the electrical switchboard. However, utilization of a single voltage measurement at the electrical switchboard for VA power value measurements of multiple feeder lines may lead to inaccurate power measurements of the feeder lines as each individual load coupled to a feeder line may have a different power factor.

Embodiments described herein provide a system and method for calculating "real power" in a feeder line by measuring the current and the voltage phase of the feeder line at the same location.

Figure 1:
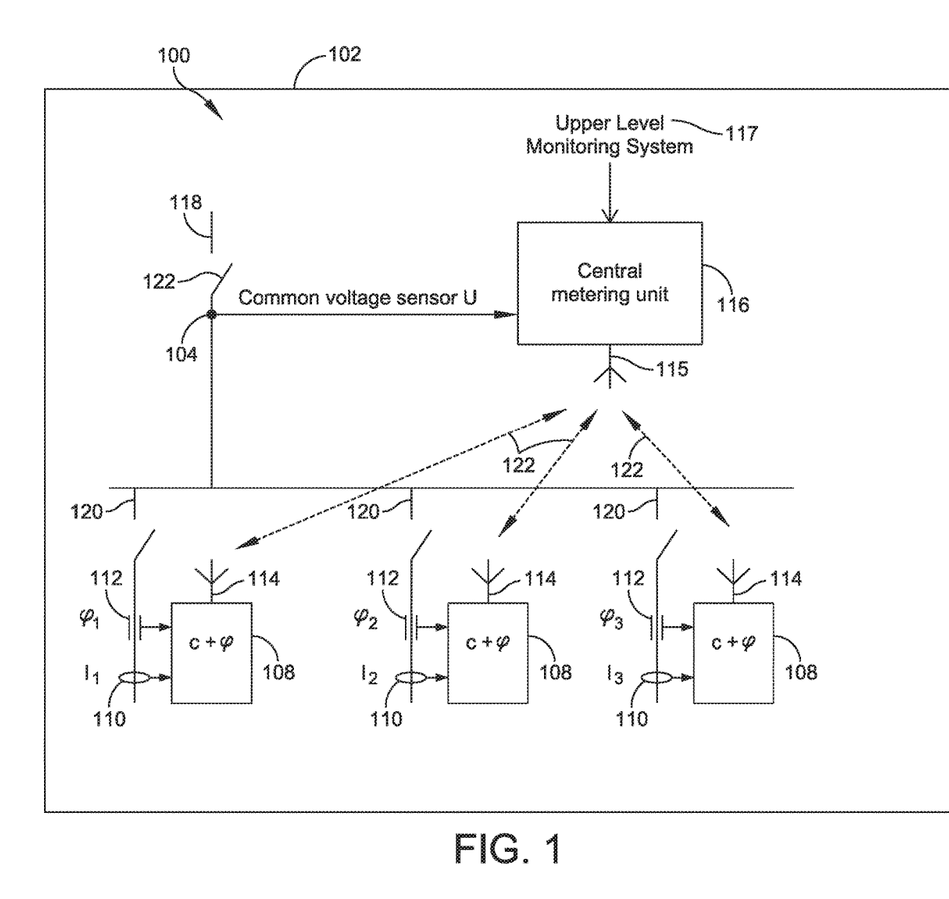
FIG. 1 is a block diagram of a power meter system according to aspects of the current invention.

FIG. 1 illustrates a power meter system 100 according to at least one embodiment described herein. The power meter system 100 is located within a housing 102 of an electrical switchboard. The power meter system 100 includes a common voltage sensor 104, a central metering unit 116, and a plurality of current and phase shift sensor circuits 108. Each current and phase shift sensor circuit 108 includes a current sensor 110, a voltage phase sensor 112, and an antenna 114. The central metering unit 116 also includes an antenna 115.

The common voltage sensor is 104 is coupled to a mains input line of the switchboard 118 and to the central metering unit 116. The central metering unit 116 is also configured to be coupled to an upper level monitoring system 117. The current 110 and phase shift 112 sensors of each current and phase shift sensor circuit 108 are both coupled to a feeder line 120 of the switchboard at or near the same location.

As input AC power is provided to the switchboard via the mains input line 118 (and consequently to loads coupled to the feeder lines 120), the common voltage sensor 104 measures the RMS voltage (U) on the mains input line 118 and sends a signal related to the RMS voltage (U) on the mains input line 118 to the central metering unit 116. The central metering unit 116 transmits a signal related to the RMS voltage (U) on the mains input line 118 to each one of the current and phase shift sensor circuits 108. According to one embodiment, the signal related to the RMS voltage (U) is transmitted wirelessly to each current and phase shift sensor circuit 108 via the antenna 115. For example, in one embodiment, the central metering unit 116 transmits wirelessly over a Zigbee network. In another embodiment, the signal related to the RMS voltage (U) is transmitted to each current and phase shift sensor circuit 108 via a hardwired connection.

As AC power from the mains input line 118 is provided to the loads via the feeder lines 120, the current sensor 110 of each current and phase shift sensor circuit 108 generates a signal related to the current through the feeder line 120 to which it is coupled. The current related signal is provided to the current and phase shift sensor circuit 108. The voltage phase sensor 112 of each current and phase shift sensor circuit 108 generates a signal related to the voltage phase on the feeder line 120 to which it is coupled. The voltage phase related signal is provided to the current and phase shift sensor circuit 108.

The current and phase shift sensor circuits 108 receive the current and voltage phase signals from the current sensors 110 and the voltage phase sensors 112. Based on the received current related signal, each current and phase shift sensor circuit 108 calculates the RMS current through its associated feeder line 120. Based on the received voltage phase related signal from the voltage phase sensor 112 and the received signal related to the RMS voltage (U) from the central metering unit 116, each current and phase shift sensor circuit 108 calculates the voltage phase shift of its associated feeder line 120.

Each current and phase shift sensor circuit 108 transmits the calculated RMS current and phase shift values to the central metering unit 116. According to one embodiment, the current and phase shift signals 122 are transmitted wirelessly via the antennas 114. For example, in one embodiment, the current and phase shift sensor circuits 108 transmit wirelessly over a Zigbee network. In another embodiment, the current and phase shift signals are transmitted to the central metering unit 116 via a hard wired connection.

The central metering unit 116 receives the current and phase shift signals. According to one embodiment, the central metering unit 116 receives the wireless current and phase shift signals 122 via the antenna 115 (e.g., via a Zigbee network). In another embodiment, the central metering unit 116 receives the current and phase shift signals via a hardwired connection.

The central metering unit 116 calculates the power use of each feeder line 120 based on the RMS current and phase shift signals associated with each feeder line 120 along with the common RMS voltage (U) received from the common voltage sensor 104. For example, in one embodiment, the central metering unit 116 calculates the power of a feeder line 120 using the following equation:

Pwr=RMS Voltage(*U*)×Feeder RMS Current(*I*)cos Feeder Phase Shift(Φ)=*U*×*I* cos Φ    (Equation 1)

According to one embodiment, the central metering unit 116 transmits the calculated power values to an upper level monitoring system 117 for additional processing. By obtaining voltage phase information at the same point at which current information is obtained, accurate measurements of "real" power on each feeder line may be made.

According to another embodiment, rather than the central metering unit 116 calculating the individual power use of each feeder line 120, the individual power use of each feeder line 120 may be calculated locally in the current and phase shift sensor circuit 108 associated with each feeder line 120. For example, a current and phase shift sensor circuit 108 may calculate the power in its associated feeder line 120 by utilizing the received RMS voltage (U), the calculated RMS feeder current and the calculated feeder phase shift. In such an embodiment, each current and phase shift sensor circuit 108 may transmit its individual calculated power value to the central metering unit 116 or directly to an upper level system 117.

Figure 2:
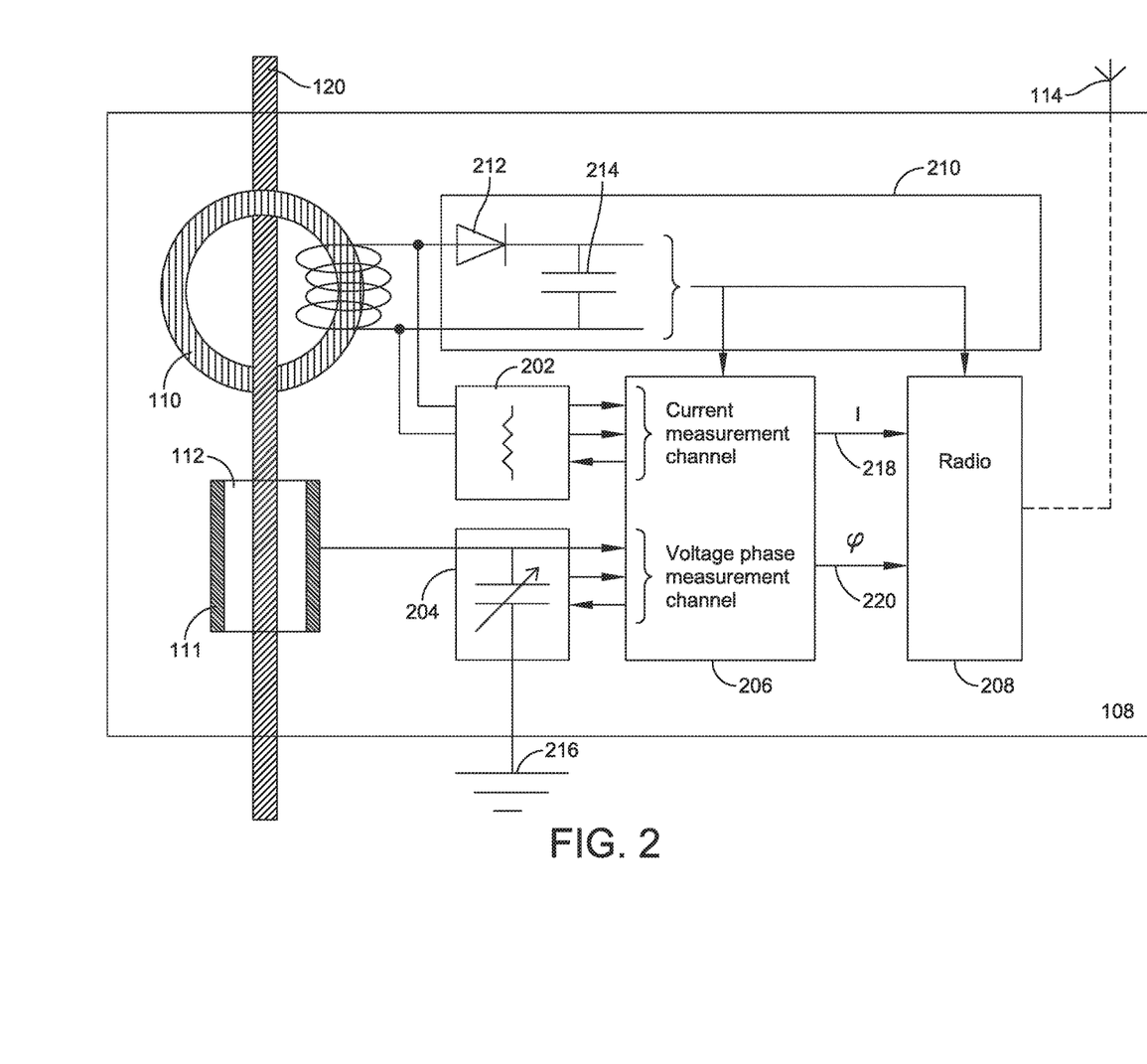
FIG. 2 is a block diagram of a current and phase shift sensor circuit according to aspects of the current invention.

FIG. 2 is a block diagram showing the current and phase shift sensor circuit 108 in greater detail. The current and phase shift sensor circuit 108 includes the current sensor 110, the voltage phase sensor 112, a burden resistor 202, an adjustable capacitor 204, a controller 206, a radio 208. According to one embodiment, the current and phase shift sensor circuit 108 also includes an optional self-power circuit 210. In one embodiment, the self-power circuit 210 includes a rectifier which includes a diode 212 and a capacitor 214.

The current sensor 110 and the voltage phase sensor 112 are coupled to the feeder line 120. According to one embodiment, the current sensor 110 and the voltage phase sensor 112 are coupled to the feeder line 120 at substantially the same location. The current sensor 110 is coupled to the controller 206 via the burden resistor 202. The voltage phase sensor 112 is coupled to the controller 206 via a capacitor 204. According to one embodiment, the capacitor 204 is an adjustable capacitor 204. The adjustable capacitor 204 is also coupled to ground 216. The controller 206 is coupled to the radio 208 via a current measurement channel 218 and a voltage phase measurement channel 220. The radio 208 is coupled to the antenna 114.

According to one embodiment, where the current and phase shift sensor circuit 108 includes the self-power circuit 210, the current sensor 110 is also coupled to the controller 206 and to the radio 208 via the rectifier (diode 212 and capacitor 214) of the self-power circuit 210.

According to one embodiment, the current sensor 110 is a Current Transformer (CT) that encircles the feeder line 120. However, in other embodiments, other types of current sensing circuits may be utilized. AC current passing through the feeder line 120 induces an AC current in the CT 110 that is proportionate to the AC current in the feeder line 120. The proportionate AC current from the CT 110 is provided to the burden resistor 202. Based on the voltage drop across the burden resistor, the controller 206 calculates the current in the feeder line 120. A signal related to the current in the feeder line 120 is provided, via a current measurement channel 218, to the radio 208.

According to one embodiment, the voltage phase sensor 112 is a contactless voltage phase sensor (i.e. it does not directly contact a conductor of the feeder line 120) that includes a voltage sensing layer 111 which encircles the feeder line 120 when the voltage phase sensor 112 is coupled around the feeder line 120. In one embodiment, the voltage sensing layer 111 is a circular or semi-circular conductive plate which mechanically encircles a portion of the feeder line 120 in such a manner as to form a capacitive element. The capacitive element provided by the voltage sensing layer 111 (having a capacitance value of $C_1$) and the adjustable capacitor 204 (having a capacitance value of $C_2$) form a capacitive voltage divider.

The controller 206 receives a signal from the voltage divider (including the voltage sensing layer 111 and the adjustable capacitor 204) which is related to the voltage ($V_C$) across the adjustable capacitor. According to one embodiment, the capacitance ($C_2$) of the adjustable capacitor is electronically controlled by the controller 206 to adjust the capacitive voltage divider ratio ($C_1/C_2$) to a desired range. Based on the capacitive voltage divider ratio ($C_1/C_2$), the sensed voltage ($V_C$) across the adjustable capacitor, and the common RMS voltage (U) received from the central metering unit 116, a phase sensor within the controller 206 calculates the voltage phase shift on the feeder line 120. A signal related to the voltage phase shift in the feeder line 120 is provided, via a voltage phase measurement channel 220, to the radio 208.

The radio 208 transmits the signals related to the current and voltage phase shift in the feeder line 120 to the central metering unit 116. According to one embodiment, the radio 208 is a Zigbee radio; however, in other embodiments, any other type of short range radio may be utilized. As discussed above, using the signals related to the current and voltage phase shift in the feeder line 120, the central metering unit 116 calculates the "real" power of the feeder line 120.

According to one embodiment, where the current and phase shift sensor circuit 108 includes the self-power circuit 210, the induced AC current in the CT 112 is also rectified by the self-power circuit 210 (i.e. by the rectifier including the diode 212 and the capacitor 214) and the resulting DC power is provided to the controller 206 and the radio 208 to power the controller 206 and radio 208. However, in other embodiments, elements of the current and phase shift sensor circuit 108 may receive power from other sources (e.g. such as a battery, another DC power supply, or another CT).

According to one embodiment, the current and phase shift sensor circuit 108 may also include interference protection circuitry. For example, in one embodiment, the voltage phase sensor 112 includes shielding configured to eliminate cross-phase interference from other closely situated wires.

Figure 3A:
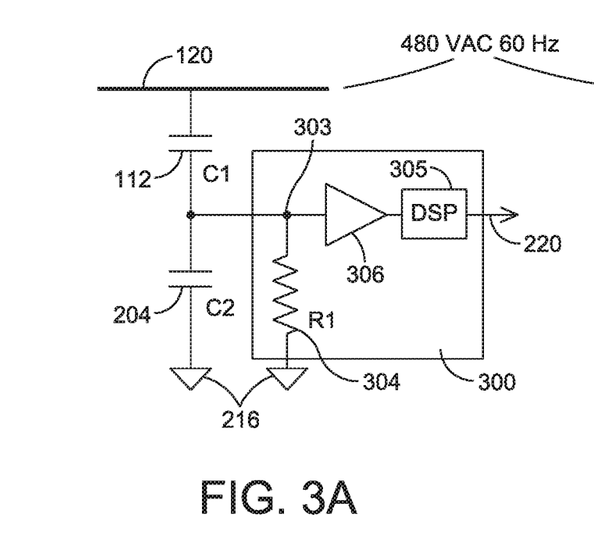
FIGS. 3A and 3B are circuit diagrams illustrating a voltage phase sensor and phase sensor according to aspects of the current invention.
Figure 3B:
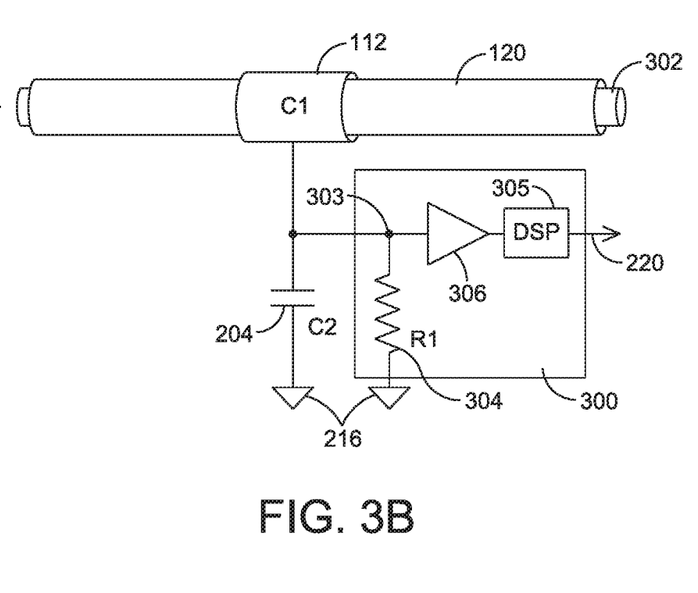

FIGS. 3A and 3B are circuit diagrams of a voltage phase sensor 112, adjustable capacitor 204 and phase sensor 300 according to aspects of the current invention. According to one embodiment, the phase sensor 300 is located within the controller 206; however, in other embodiments, the phase sensor 300 may be configured differently.

The phase sensor 300 includes a resistor 304 having a resistance value ($R_1$), a measurement amplifier 306, and a Digital Signal Processor (DSP) 305. The resistor is coupled between a node 303 and ground 216. The node 303 is coupled to a junction point between the voltage shift sensor 112 and the adjustable capacitor 204. The measurement amplifier 306 is coupled between the node 303 and the DSP 305. The DSP 305 is coupled between the amplifier 306 and the voltage phase measurement channel 220.

As discussed above, the voltage phase sensor 112 is coupled to a feeder line 120. According to one embodiment, as seen in FIG. 3B, the voltage phase sensor 112 is a contactless voltage phase sensor (i.e. it does not directly contact a conductor 302 of the feeder line 120) which includes a voltage sensing layer that encircles the feeder line 120 when the voltage phase sensor 112 is coupled around the feeder line 120. In one embodiment, the voltage sensing layer is a circular or semi-circular conductive plate which mechanically encircles a portion of the feeder line 120 in such a manner as to form a capacitive element. The capacitive element provided by the voltage sensing layer 111 (having a capacitance value of $C_1$) and the adjustable capacitor 204 (having a capacitance value of $C_2$) form a capacitive voltage divider.

As AC power is provided to the feeder line 120 from the mains input line 118, the phase sensor 300 receives a signal from the voltage divider (including the voltage phase sensor 112 and the adjustable capacitor 204) which is related to the voltage ($V_C$) across the adjustable capacitor. According to one embodiment, the capacitance ($C_2$) of the adjustable capacitor is electronically controlled by the controller 206 to adjust the capacitive voltage divider ratio $C_1/C_2$ to a desired range. Based on the signal related to the voltage across the adjustable capacitor ($V_C$) received from the voltage divider, the capacitance ($C_2$) of the adjustable capacitor 204 set by the controller 206, the resistance $R_1$ of the resistor 304, and the common RMS voltage (U) received from the central metering unit 116, the DSP 305 calculates the voltage phase shift in the feeder line 120 using the following equations: ω is the angular frequency of periodic signals which is defined as $$C_1/C_2 = V_C/U \quad \text{(Equation 2)}$$

$$\Phi = 1/(\omega R_1(C_1+C_2)) \quad \text{(Equation 3)}$$

$$\omega = 2\pi/T, \text{ where } T \text{ is the period} \quad \text{(Equation 4)}$$

The DSP 305 provides a signal related to the phase shift in the feeder line 120 to the radio 208 via the voltage phase measurement channel 220. The radio 208 transmits the signal related to the phase shift in the feeder line 120 (along with the signal related to the current in the feeder line 120) to the central metering unit 116. As discussed above, using the current and voltage phase signals, the central metering unit 116 calculates the power of the feeder line 120.

As described herein, the current and phase shift sensor circuits are located within a housing of an electrical switchboard; however, the current and phase shift sensor circuits may be located at different locations within the electrical system (e.g., at a load).

As described herein, the current and phase shift sensor circuits, common voltage sensor and central metering unit are located within a housing of an electrical switchboard; however, in other embodiments, these components may be located at different locations external the housing of the electrical switchboard.

As also described herein, the current and phase shift sensor circuits are installed within an electrical switchboard; however, in other embodiments, the current and phase shift sensor circuits may be installed in any type of electrical system in which it is desired to monitor "real" power of a line.

By measuring the current and the voltage phase shift of a feeder line at substantially the same location, an accurate "real" power reading of the feeder line may be made. Also, by measuring the current and the voltage phase shift of the feeder line without directly contacting a conductor of the feeder line (e.g., with a CT and a capacitive voltage sensor), the practicality and safety problems associated with directly contacting an energized circuit may be reduced.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A power meter, the power meter comprising:
    a voltage sensor configured to be coupled to an input line that receives input AC power from an AC power source;
    at least one current and phase sensor circuit configured to be coupled to a feeder line that provides at least a portion of the input AC power from the input line to a load; and
    a central metering unit coupled to the voltage sensor,
    wherein the voltage sensor is further configured to measure a voltage on the input line and transmit a signal related to the voltage on the input line to the central metering unit,
    wherein the at least one current and phase sensor circuit is further configured to measure a current of the feeder line, to calculate a voltage phase shift between a voltage on the feeder line and the voltage on the input line, and to transmit a signal related to at least one of the current of the feeder line and the voltage phase shift to the central metering unit, and
    wherein the central metering unit is configured to calculate power provided to the load via the feeder line based on the signal transmitted from the at least one current and phase sensor circuit.

2. The power meter of claim 1, wherein the at least one current and phase sensor circuit comprises:
    a current sensor configured to be coupled to the feeder line and to generate a signal proportional to the current in the feeder line; and
    a controller coupled to the current sensor, wherein the controller is configured to calculate the current of the feeder line based on the signal proportional to the current in the feeder line and transmit the signal related to the current of the feeder line to the central metering unit.

3. The power meter of claim 2, wherein the current sensor is a Current Transformer (CT).

4. The power meter of claim 2, wherein the at least one current and phase sensor further comprises:
    a voltage phase sensor coupled to the feeder line;
    a capacitive voltage divider including the voltage phase sensor and a capacitor coupled between the voltage phase sensor and ground, the capacitive voltage divider having a capacitive voltage divider ratio; and
    wherein the central metering unit is further configured to transmit the signal related to the voltage on the input line to the controller, and
    wherein the controller is further coupled to the voltage phase sensor and configured to measure a voltage across the capacitor of the voltage divider, calculate the voltage phase shift between the voltage on the feeder line and the voltage on the input line based on the voltage across the capacitor, the signal related to the voltage on the input line, and the capacitive voltage divider ratio, and to transmit the signal related to the voltage phase shift to the central metering unit.

5. The power meter of claim 4, wherein the voltage phase sensor comprises a voltage sensing layer configured to form a capacitive element with a conductor of the feeder line when the voltage phase sensor is coupled to the feeder line.

6. The power meter of claim 5, wherein the voltage sensing layer is a conductive plate which is configured to encircle a portion of the conductor of the feeder line when the voltage phase sensor is coupled around the feeder line.

7. The power meter of claim 4, wherein the at least one current and phase sensor further comprises:
    a wireless communications circuit configured to wirelessly transmit the signal related to the current of the feeder line and the signal related to the voltage phase shift to the central metering unit.

8. The power meter of claim 7, wherein the at least one current and phase sensor further comprises:
    a power circuit coupled to the current sensor and configured to receive the signal proportional to the current in the feeder line, rectify the signal proportional to the current and provide resulting DC power to at least one of the controller and the wireless communications circuit.

9. The power meter of claim 4, wherein the controller comprises a phase sensor coupled to the voltage divider, the phase sensor comprising:
    a resistor having a resistance and coupled between the capacitive voltage divider and ground;
    a measurement amplifier coupled to the capacitive voltage divider; and
    a Digital Signal Processor (DSP) coupled to the measurement amplifier, wherein the DSP is configured to calculate the voltage phase shift between the voltage on the feeder line and the voltage on the input line based on the voltage across the capacitor, the signal related to the voltage on the input line, the capacitive voltage divider ratio and the resistance of the resistor.

10. The power meter of claim 4, wherein the voltage phase sensor and the current sensor are coupled to the feeder line at substantially a same location.

11. The power meter of claim 4, wherein the capacitor is an adjustable capacitor and wherein the controller is further configured to control the adjustable capacitor to adjust the capacitive voltage divider ratio.

12. The power meter of claim 1, wherein at least one of the at least one current and phase sensor circuit, the voltage sensor, and the central metering unit are configured to be located within an electrical switchboard.

13. A method for measuring power provided by a feeder line of an electrical system to a load, the electrical system receiving AC power from an AC source on an input line, the method comprising acts of:
    measuring, with a voltage sensor coupled to the input line, an input voltage on the input line;
    measuring, with a current sensor coupled to the feeder line, a current of the feeder line;
    calculating, with a voltage phase sensor coupled to the feeder line, a voltage phase shift between a voltage on the feeder line and the input voltage on the input line; and
    calculating, based on the current of the feeder line, the voltage phase shift, and the input voltage on the input line, a power level being provided to the load via the feeder line.

14. The method of claim 13, further comprising:
    transmitting, by the voltage sensor, a signal related to the input voltage, to a central metering unit; and
    transmitting, by the central metering unit, a signal related to the input voltage to the voltage phase sensor.

15. The method of claim 14, wherein calculating the voltage phase shift between the voltage on the feeder line and the voltage on the input line comprises:
    measuring, with a controller coupled to the voltage phase sensor and the current sensor, a voltage produced by a capacitive voltage divider of the voltage phase sensor, the capacitive voltage divider having a capacitive voltage divider ratio;

receiving, with the controller, the signal related to the common input voltage from the central metering unit; and calculating, with the controller, the voltage phase shift between the voltage on the feeder line and the voltage on the input line based on the voltage produced by the capacitive voltage divider, the capacitive voltage divider ratio and the common input voltage.

16. The method of claim 15, further comprising adjusting the capacitive voltage divider ratio to a desired range.

17. The method of claim 13, wherein measuring the current of the feeder line comprises:

generating, with the current sensor, a signal proportional to the current of the feeder line; and calculating, with the controller, based on the signal proportional to the current, the current of the feeder line.

18. The method of claim 17, further comprising transmitting wirelessly, with the controller, a signal related to the voltage phase shift and a signal related to the current of the feeder line to the central metering unit.

19. The method of claim 13, wherein the acts of measuring a current of the feeder line and calculating voltage phase shift of the feeder line are performed at substantially a same location.

20. A system for measuring power provided by a feeder line of an electrical system to a load, the electrical system receiving AC power from an AC source on an input line, the system:

a voltage sensor configured to be coupled to the input line and to measure voltage on the input line;

a central metering unit coupled to the voltage sensor and configured to receive, from the voltage sensor, a signal related to the voltage on the input line; and means for measuring current of the feeder line and calculating a voltage phase shift between a voltage on the feeder line and the voltage on the input line at substantially a same location and without direct connection to a conductor within the feeder line, wherein the central metering unit is configured to calculate power provided to the load via the feeder line based on the measured current and voltage phase shift of the feeder line.

* * * * *